(12) United States Patent
Kim (10) Patent No.: US 8,716,775 B2
(45) Date of Patent: *May 6, 2014

(54) SEMICONDUCTOR INTEGRATED CIRCUIT HAVING RESERVOIR CAPACITOR

(75) Inventor: Jong Su Kim, Icheon (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/616,054

(22) Filed: Sep. 14, 2012

(65) Prior Publication Data

US 2013/0026551 A1     Jan. 31, 2013

Related U.S. Application Data

(63) Continuation-in-part of application No. 13/340,847, filed on Dec. 30, 2011.

(30) Foreign Application Priority Data

Jul. 27, 2011   (KR) .......................... 10-2011-0074469
Dec. 20, 2011   (KR) .......................... 10-2011-0138126

(51) Int. Cl.
*H01L 27/108*   (2006.01)
*H01L 27/11*    (2006.01)
*H01L 27/088*   (2006.01)
*H01L 21/31*    (2006.01)

(52) U.S. Cl.
USPC ............ 257/296; 257/379; 257/390; 438/765

(58) Field of Classification Search
USPC .......................................... 257/296, 379, 390
See application file for complete search history.

(56) References Cited

U.S. PATENT DOCUMENTS

| | | | | |
|---|---|---|---|---|
| 4,879,631 | A | * | 11/1989 | Johnson et al. .......... 361/679.31 |
| 5,304,506 | A | * | 4/1994 | Porter et al. .................. 438/394 |
| 5,633,785 | A | * | 5/1997 | Parker et al. .................. 361/766 |
| 5,874,854 | A | * | 2/1999 | Skergan ........................ 327/545 |
| 2006/0024905 | A1 | * | 2/2006 | He et al. ........................ 438/396 |
| 2006/0289932 | A1 | * | 12/2006 | Ahn et al. ..................... 257/334 |

* cited by examiner

*Primary Examiner* — Long K Tran
*Assistant Examiner* — Dzung Tran
(74) *Attorney, Agent, or Firm* — William Park & Associates Patent Ltd.

(57) ABSTRACT

A semiconductor integrated circuit including a large capacity reservoir capacitor to provide suitable power is provided. The semiconductor integrated circuit includes a semiconductor substrate in which a cell area and a peripheral circuit area are defined, a MOS capacitor formed on the semiconductor substrate corresponding to the peripheral circuit area, and a dummy capacitor group formed on the peripheral circuit area to overlap the MOS capacitor. One electrode of the MOS capacitor and one electrode of the dummy capacitor group are connected to each other and the other electrode of the MOS capacitor and the other electrode of the dummy capacitor group are connected to difference voltage sources from each other.

19 Claims, 9 Drawing Sheets

SEMICONDUCTOR INTEGRATED CIRCUIT HAVING RESERVOIR CAPACITOR

CROSS-REFERENCES TO RELATED APPLICATION

The application is a continuation-in-part of application Ser. No. 13/340,847, filed Dec. 30, 2011, titled "SEMICONDUCTOR INTEGRATED CIRCUIT HAVING CAPACITOR FOR PROVIDING STABLE POWER AND METHOD OF MANUFACTURING THE SAME", which is incorporated herein by reference in its entirety.

A claim of priority under 35 U.S.C §119 is made to Korean Patent Application No. 10-2011-0138126, filed Dec. 20, 2011. The disclosure of the priority application is incorporated herein by reference in its entirety.

BACKGROUND OF THE INVENTION

1. Technical Field

The present invention relates generally to a semiconductor integrated circuit and a method of fabricating the same, and more particularly, to a semiconductor integrated circuit having a dummy capacitor.

2. Related Art

High integration, low voltage, and high speed are some key parameters to estimate the performance of semiconductor integrated circuits. When power, which may have many levels, is supplied into the semiconductor integrated circuit, noise is necessarily involved, which may vary signal transfer characteristics of a device, such as the delay value.

To account for this problem, a capacitor to remove noise, such as a reservoir capacitor, is formed in a peripheral circuit area of the semiconductor integrated circuit.

The capacitor to remove noise is configured by stacking a conductive layer, a dielectric layer, and a conductive layer in an empty space of the peripheral circuit area and ensures larger capacitance and stable power.

SUMMARY

According to an aspect of an embodiment, a semiconductor integrated circuit may include: a semiconductor substrate in which a cell area and a peripheral circuit area are defined; a metal oxide semiconductor (MOS) capacitor formed on the semiconductor substrate corresponding to the peripheral circuit area; and a dummy capacitor group formed on the peripheral circuit area to overlap the MOS capacitor. One electrode of the MOS capacitor and one electrode of the dummy capacitor group are connected to each other while the other electrode of the MOS capacitor and the other electrode of the dummy capacitor group are connected to different voltage sources.

According to another embodiment, a semiconductor integrated circuit may include: a semiconductor substrate including a cell area and a peripheral circuit area; a plurality of cell array areas formed on the cell area and including a plurality of cell capacitors; a plurality of dummy capacitor groups formed on the peripheral circuit area and connected to each other; and a MOS capacitor arranged between the semiconductor substrate and the plurality of dummy capacitor groups and electrically connected to one of the plurality of dummy capacitor groups.

These and other features, aspects, and embodiments are described below in the section entitled "DESCRIPTION OF EMBODIMENTS".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EMBODIMENTS

Hereinafter, various embodiments will be described in greater detail with reference to the accompanying drawings.

Various embodiments are described herein with reference to cross-sectional illustrations that are schematic illustrations of various embodiments (and intermediate structures). As such, regional variations as a result of manufacturing techniques and/or tolerances for example, are to be expected. Thus, these embodiments should not be construed as limiting to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on another layer or substrate, or have intervening layers present.

Figure 1:
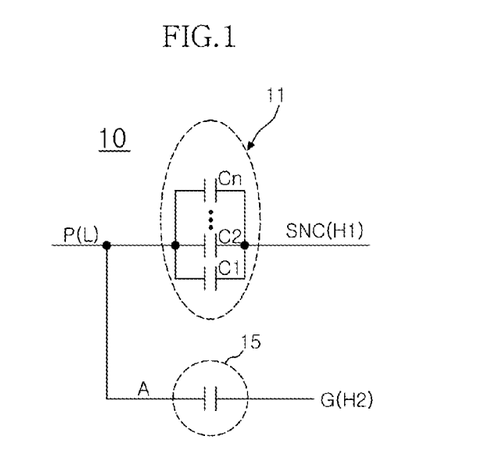
FIG. 1 is an equivalent circuit diagram illustrating a semiconductor integrated circuit including a capacitor according to an embodiment of the present invention.
Figure 2:
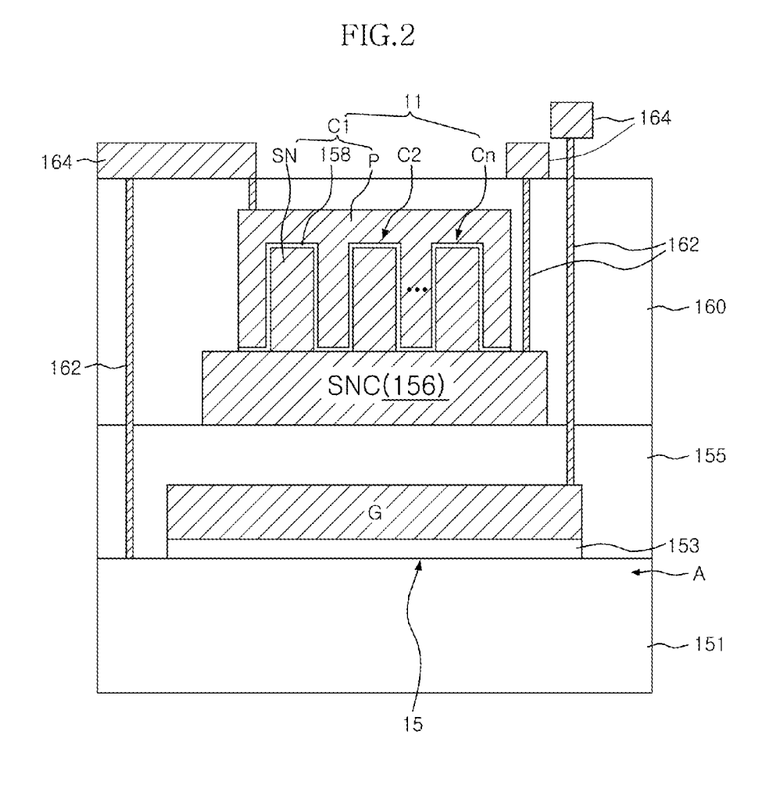
FIG. 2 is a cross-sectional view illustrating a semiconductor integrated circuit according to an embodiment of the present invention.

FIG. 1 is an equivalent circuit diagram illustrating a semiconductor integrated circuit including a large capacitor and FIG. 2 is a cross-sectional view illustrating a semiconductor integrated circuit according to an embodiment of the present invention.

Referring to FIGS. 1 and 2, a large capacitor 10 that provides stable power formed in a peripheral circuit area may include a dummy cell capacitor group 11 and a metal oxide semiconductor (MOS) capacitor 15.

The dummy cell capacitor group 11 may include a plurality of dummy capacitors C1, C2, . . . , Cn connected in parallel between a dummy plate electrode P and a dummy storage node contact unit SNC, both of which may be disposed in the peripheral circuit area. A plate electrode (not shown) and a storage node contact unit (not shown) formed in a cell area may be simultaneously formed in the same shape as the dummy plate electrode P and the dummy storage node contact unit SNC, respectively.

The MOS capacitor 15 may be a dummy MOS capacitor 15 arranged below the dummy cell capacitor group 11, and may include an active region A (corresponding to a channel region below a gate electrode G), and the gate electrode G arranged on the active region A. The active region is electrically connected to the dummy plate electrode P. The active region A and the dummy plate electrode P may receive a low voltage L, and the dummy storage node contact unit SNC and the gate electrode G may be electrically connected to separate voltage sources, respectively. Specifically, the dummy storage node contact unit SNC may receive a high voltage H1 of a first voltage level and the gate electrode G may receive a high voltage H2 of a second voltage level different from the first level.

The term "electrically connected" may be interpreted as an electrical contact and may denote an electrical conduction through general multiple metal interconnections.

FIG. 2 is a cross-sectional view schematically illustrating the semiconductor device having the configuration of FIG. 1.

As shown in FIG. 2, a gate insulating layer 153 and the gate electrode G are formed on a semiconductor substrate 151 in which the active region A is defined. A first interlay insulating layer 155 is formed on the resultant structure on which the dummy storage node contact units SNC 156 including a plurality of dummy storage electrodes SN are formed. A dielectric layer 158 is covered on the upper surfaces of the dummy storage node contact unit SNC, the dummy storage electrodes SN, and the dummy cell capacitor group, and the dummy plate electrode P is formed directly on the dielectric layer 158. The active region A and the dummy plate electrode P are electrically connected to a contact plug 162 and a metal interconnection 164. The dummy storage node contact unit SNC and the electrode G are connected to a first and second power source, respectively, through the contact plug 162 and the metal interconnection 164. The metal interconnections may be arranged on the same or different planes with an insulating layer interposed between the planes.

In this embodiment, a reservoir capacitor to remove noise is simultaneously fabricated in a spare space of the peripheral circuit area using a MOS transistor fabrication process and a capacitor fabrication process of the cell area. It is possible to fabricate the cell capacitor-graded capacitor to remove noise in the peripheral circuit area having a relatively large area margin without an additional process thereby the possibility of supplying stable power.

The above reservoir capacitor to remove noise is integrated in the peripheral circuit area in which most power sources are integrated so that a noise removal efficiency and coupling are further enhanced.

Different voltages may be applied to electrodes of the dummy capacitor group and the MOS capacitor, for example, the dummy storage node contact unit SNC and the gate electrode G, thereby ensuring various capacitances.

Figure 3:
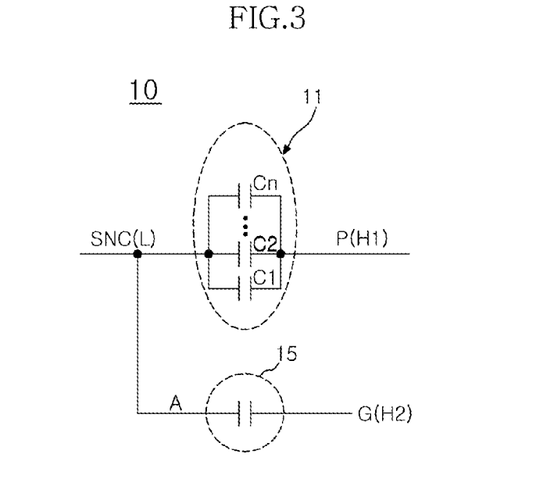
FIGS. 3, 5, 7, 9, 11, and 13 are equivalent circuit diagrams illustrating semiconductor integrated circuits according to other embodiments of the present invention.
Figure 4:
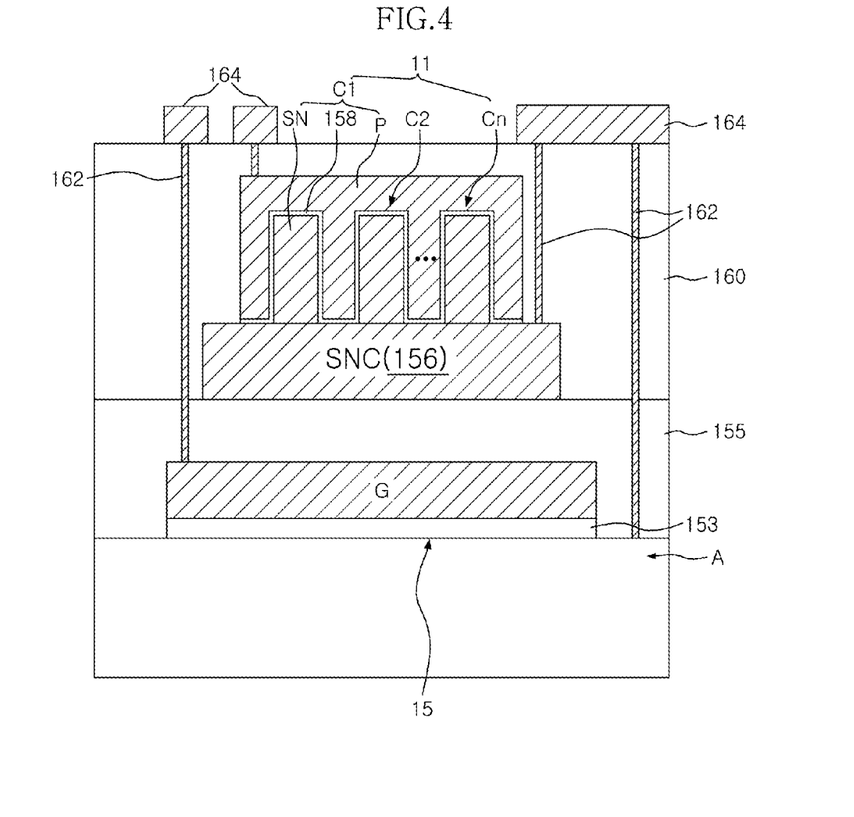
FIGS. 4, 6, 8, 10, 12, and 14 are cross-sectional views illustrating semiconductor integrated circuits according to other embodiments of the present invention.

In the embodiment, the structure in which the active region A of the MOS capacitor 15 is connected to the dummy plate electrode P has been described. However, the present invention is not limited thereto and an active region A of a MOS capacitor 15 may be connected to a dummy storage node contact unit SNC and a dummy plate electrode P may be connected to a separate power source as shown in FIGS. 3 and 4.

Figure 5:
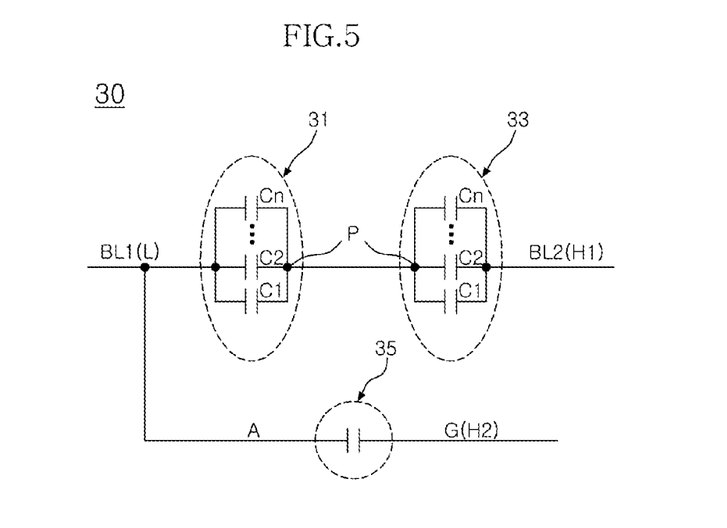
Figure 6:
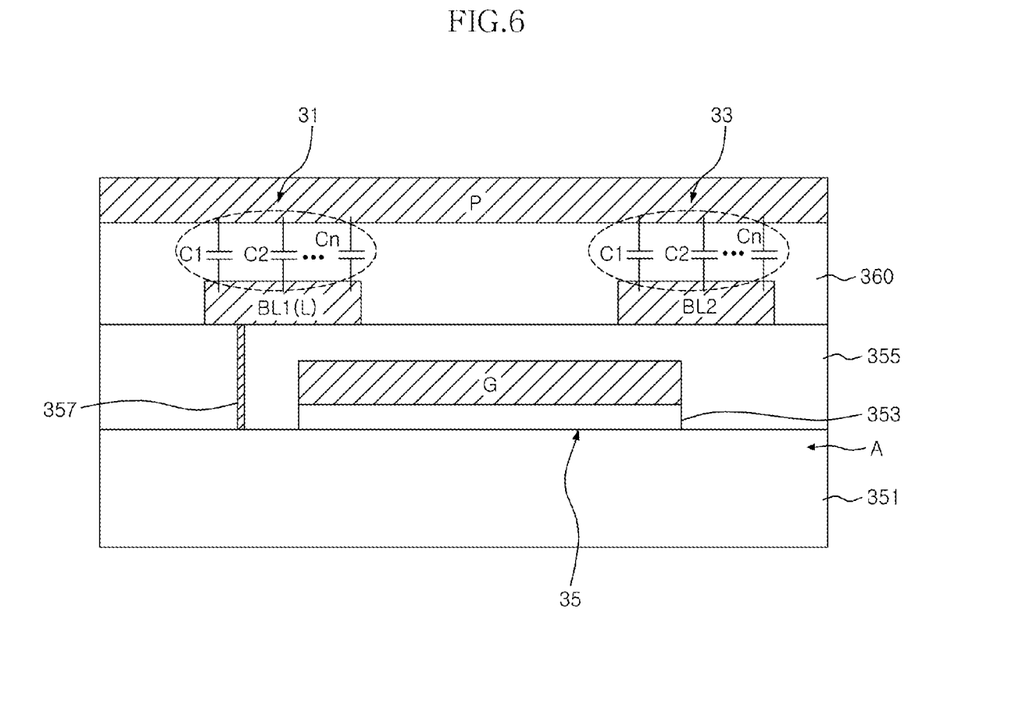

FIG. 5 is an equivalent circuit diagram illustrating a semiconductor integrated circuit including a dummy capacitor according to another embodiment of the present invention, and FIG. 6 is a corresponding cross-sectional view illustrating a semiconductor integrated circuit including a dummy capacitor according to another embodiment of the present invention.

Referring to FIGS. 5 and 6, a capacitor 30 includes a first dummy capacitor group 31, a second dummy capacitor group 33, and a MOS capacitor 35.

The first dummy capacitor group 31 may include a plurality of dummy capacitors C1, C2, ..., Cn generated between a first dummy bit line BL1 and a dummy plate electrode P.

The second dummy capacitor group 33 may include a plurality of dummy capacitors C1, C2, ..., Cn generated between the dummy plate electrode P and a second dummy bit line BL2.

The MOS capacitor 35 is generated between an active region A in a semiconductor substrate 351 and a gate electrode G, and the active region A is electrically connected to the first bit line BL1, for example, through a contact plug 357.

Although not shown in FIG. 6, the second bit line BL2 and the gate electrode G may be connected to separate power sources, respectively.

The gate G constituting the MOS capacitor 35 is entirely formed to overlap a region in which the first and second bit lines BL1 and BL2 are formed, thereby ensuring a larger capacitance To handle charge and discharge capabilities, the first dummy bit line BL1 and the active region A in the first and second dummy capacitor groups 31 and 33 and the MOS capacitor 35, may receive a low voltage L, the second dummy bit line BL2 may receive a high voltage H1 of a first voltage level, and the gate electrode G may receive a high voltage H2 of a second voltage level.

In FIG. 6, the reference numeral 353 denotes a gate insulating layer, 355 denotes a first interlayer insulating layer, and 360 denotes a second interlayer insulating layer.

As described above, two dummy capacitor groups 31 and 33 connected to each other are used and thereby ensuring a larger capacity reservoir capacitor.

Figure 7:
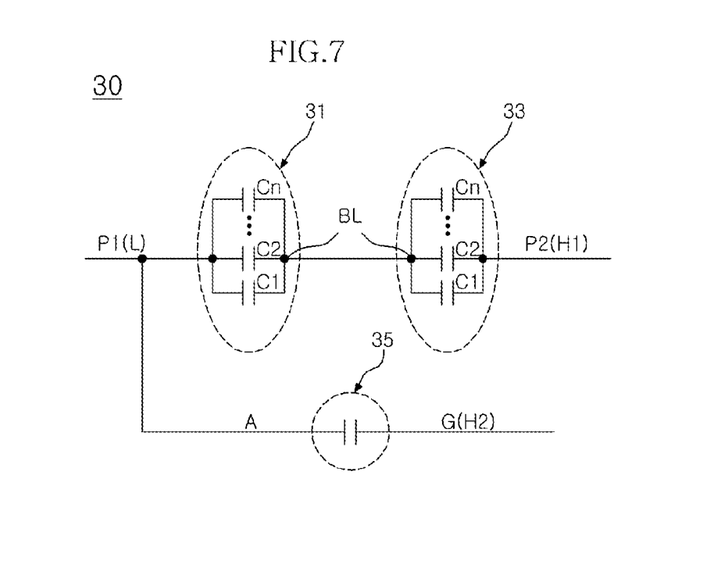
Figure 8:
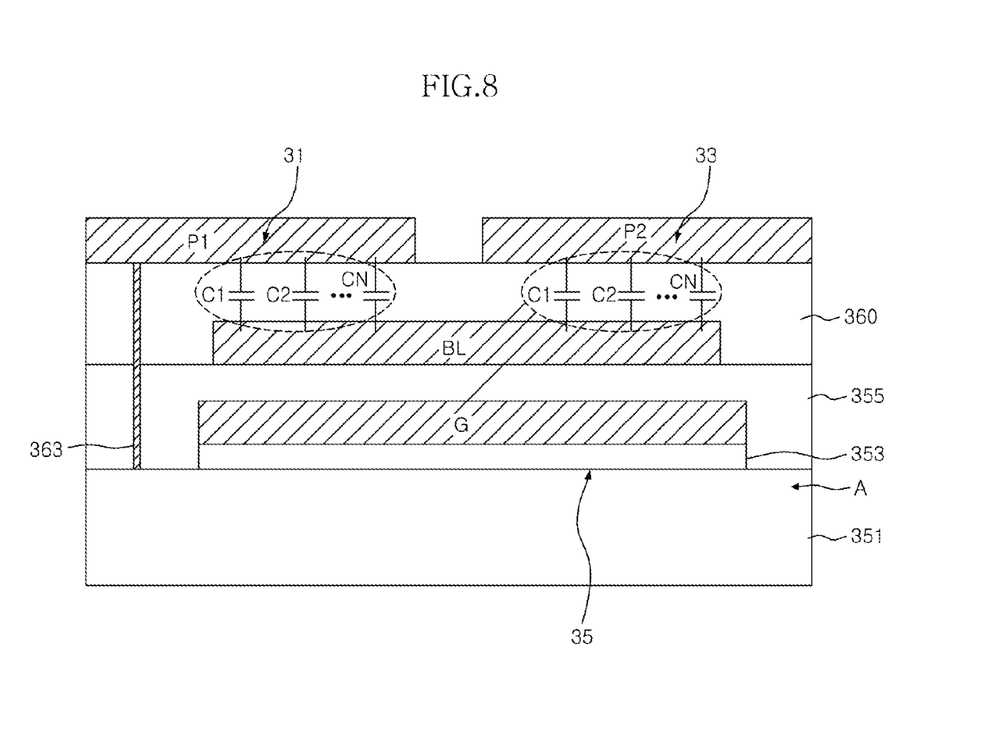

As shown in FIGS. 7 and 8, a first dummy capacitor group 31 may be generated between a first dummy plate electrode P1 and a dummy bit line BL and a second dummy capacitor group 33 may be generated between a second dummy plate electrode P2 and the dummy bit line BL.

The first dummy plate electrode P1 may be electrically connected to an active region A, for example, by a contact plug 363 and the second dummy plate electrode P2 and a gate electrode G may be connected to separate power sources, respectively.

To handle charge and discharge capabilities of the first and second dummy capacitor groups 31 and 33 and a MOS capacitor 35, the first dummy plate electrode P1 and the active region A may receive a low voltage L, the second dummy plate electrode P2 may receive a high voltage H1 of a first voltage level, and the gate G may receive a high voltage H2 of a second voltage level.

In addition, areas of the first and second dummy plate electrodes P1 and P2 may correspond to an area of a cell array.

Figure 9:
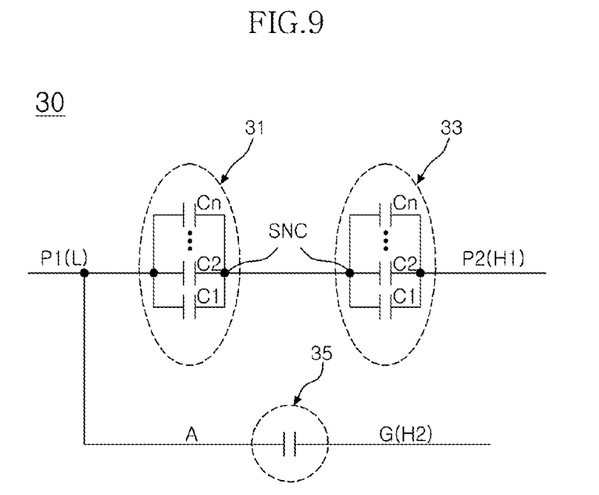
Figure 10:
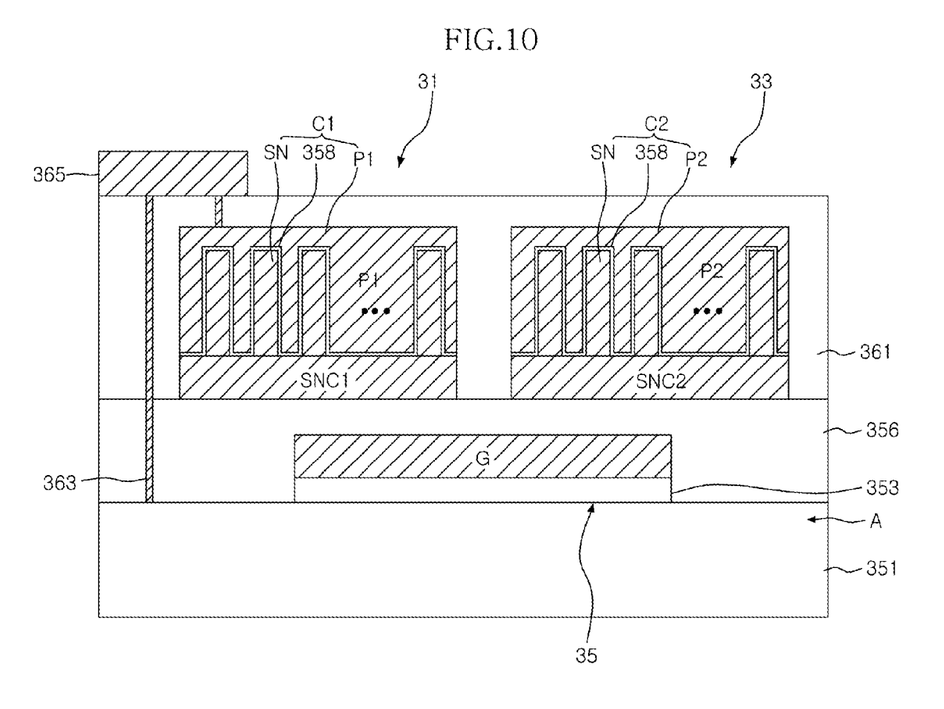

As shown in FIGS. 9 and 10, a first dummy capacitor group 31 may be generated between a first plate electrode P1 and a dummy storage node contact unit SNC and a second dummy capacitor group 33 may be generated between the dummy storage node contact unit SNC and a second dummy plate electrode P2.

The first dummy plate electrode P1 may be electrically connected, for example, by a contact plug 363 and a metal interconnection 365 and the second dummy plate electrode P2 and a gate electrode G may be connected to separate power sources, respectively.

To handle charge and discharge capabilities of the first and second dummy capacitor groups 31 and 33 and a MOS capacitor 35, for example, the first dummy plate electrode P1 and an active region A may receive a low voltage L, the second dummy plate electrode P2 may receive a high voltage H1 of a first voltage level, and the gate electrode G may receive a high voltage H2 of a second voltage level.

Areas of the first and second dummy plate electrodes P1 and P2 may correspond to an area of a cell array.

The dummy storage node contact unit SNC may be formed of a single layer or broken layers receiving the same voltage.

Figure 11:
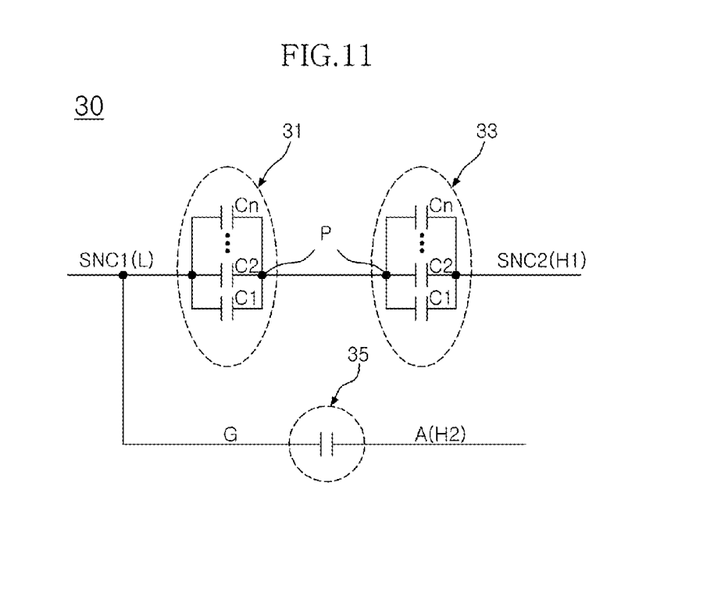
Figure 12:
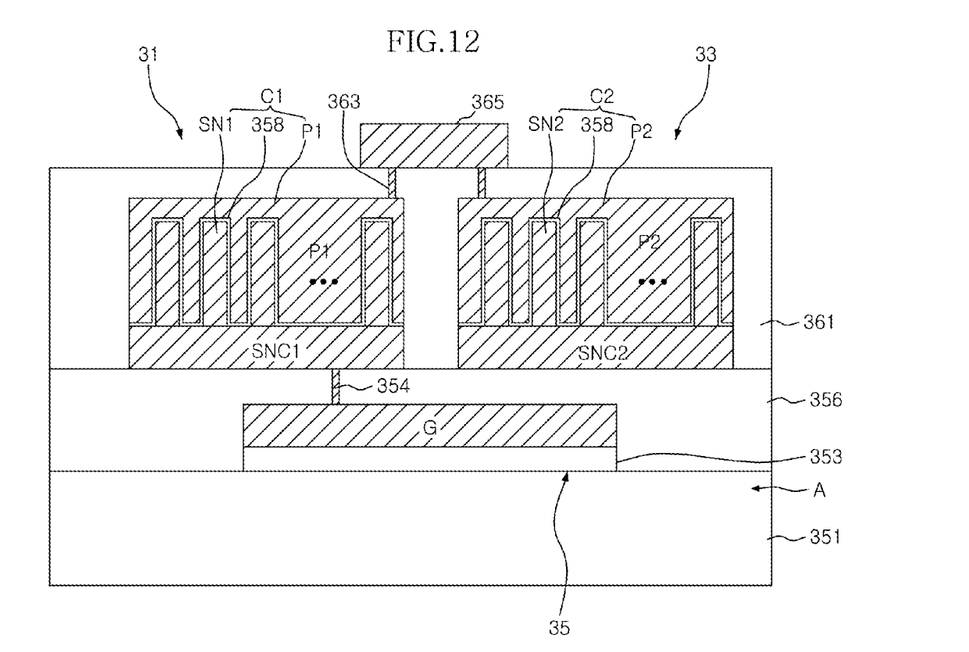

As shown in FIGS. 11 and 12, a first dummy capacitor group 31 may be generated between a first dummy storage contact unit SNC1 and a dummy plate electrode P and a second dummy capacitor group 33 may be generated between the dummy plate electrode P and a second dummy storage node contact unit SNC2.

The first dummy storage node contact unit SNC1 may be electrically connected to a gate electrode G by a conductive plug 354. The second dummy storage node contact unit SNC2 and an active region A may be connected to separate power source, respectively.

To handle charge and discharge capabilities of the first and second dummy capacitor groups 31 and 33 and a MOS capacitor 35, for example, the first dummy storage node contact unit SNC1 and the gate electrode G may receive a low voltage L, the second dummy storage node contact unit SNC2 may receive a high voltage H1 of a first voltage level, and the active region may receive a high voltage of a second voltage level.

Areas of the first and second dummy storage node contact units SNC1 and SNC2 may correspond to an area of a cell array. The dummy plate electrode P may be formed of a single layer, or alternatively, as shown in FIG. 12, the dummy plate electrode P may include first and second dummy plate electrodes P1 and P2 which are electrically connected by a metal plug 363 and a metal interconnection 365.

Figure 13:
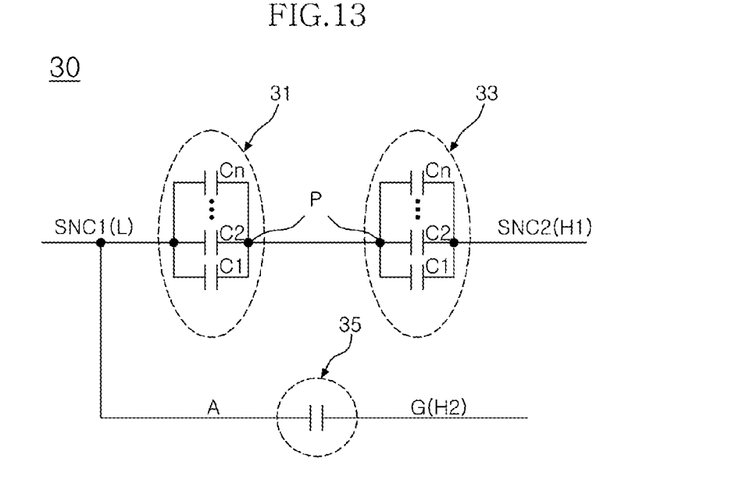
Figure 14:
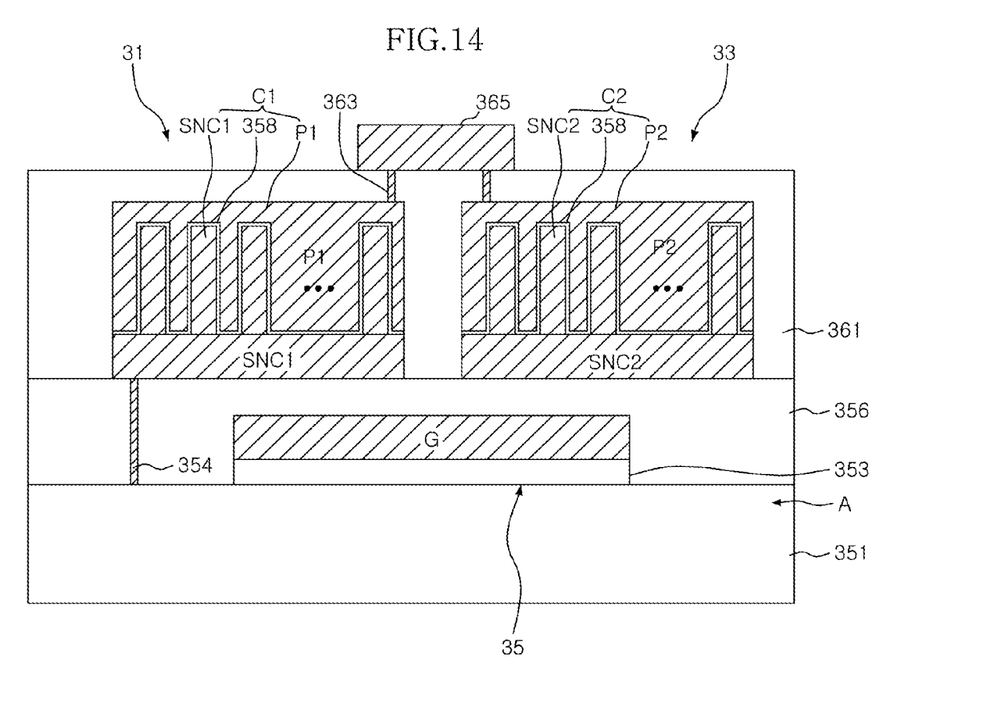

As shown in FIGS. 13 and 14, instead of a gate electrode G, a dummy storage node contact unit SNC1 may be connected to an active region A and the gate electrode may be connected to a separate power source.

Figure 15:
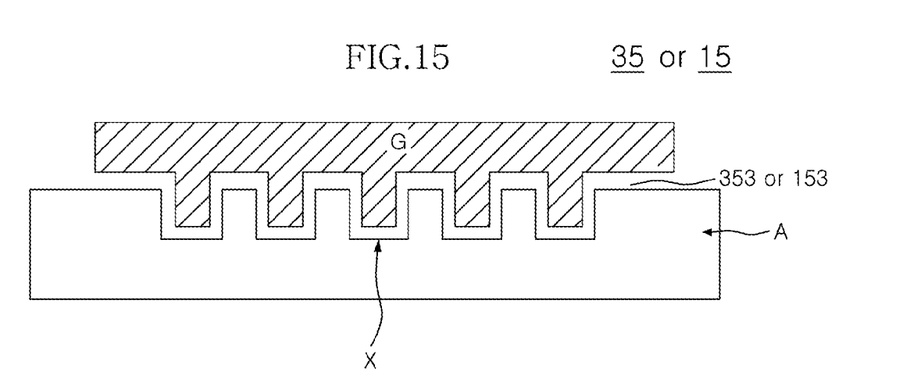
FIG. 15 is an equivalent circuit diagram illustrating a semiconductor integrated circuit according to another embodiment of the present invention.

To further increase the capacitance of the MOS capacitor in the above embodiments, as shown in FIG. 15, a bending x may be formed on a contact surface between a gate electrode G and a gate insulating layer 153 or 353. Thus, the contact area between the gate electrode G and an active region A is increased, thereby increasing capacitance. The bending x may be formed through a pretreatment process such as an ion implantation process and an oxidation process before the gate insulating layer 153 or 353 is formed.

Figure 16:
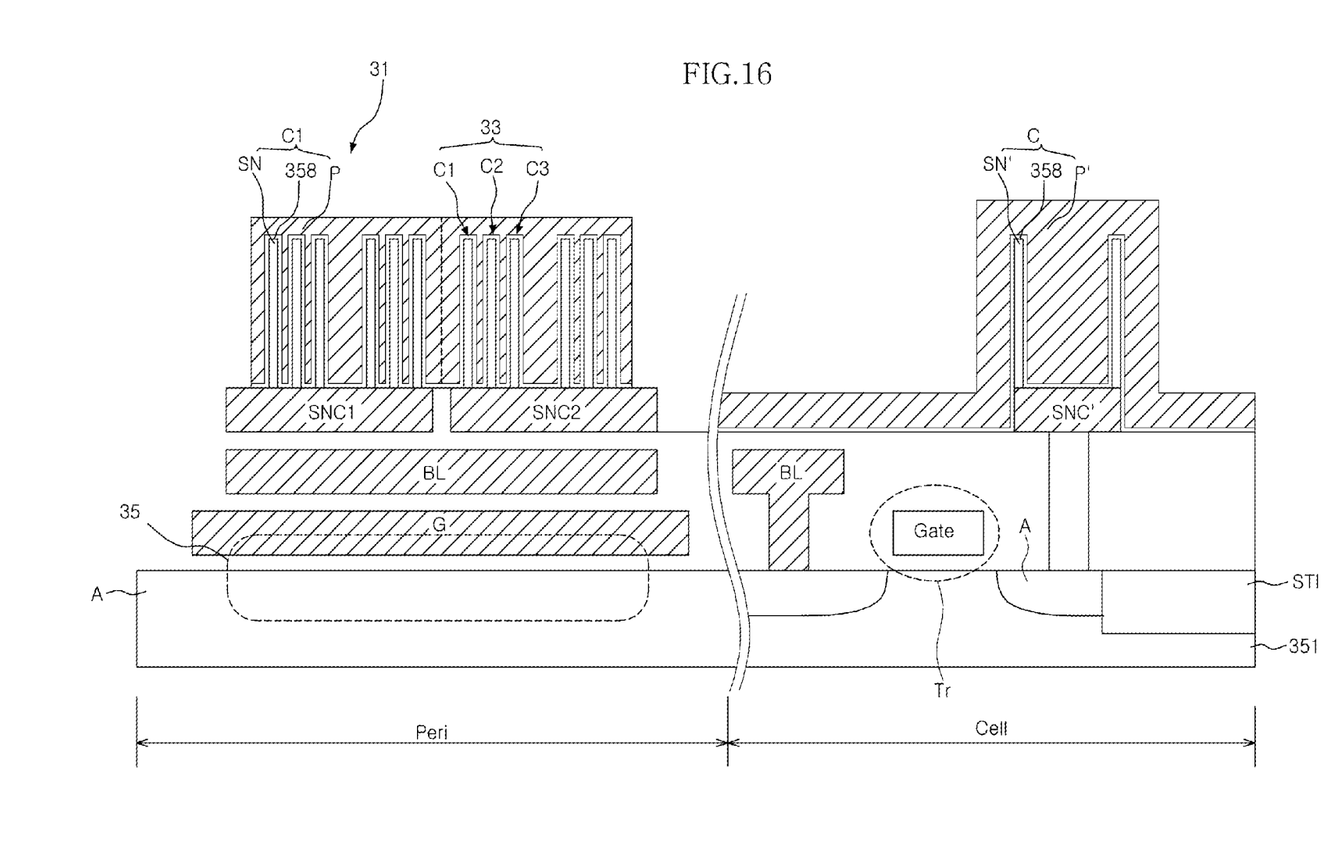
FIG. 16 is a cross-sectional view of a semiconductor integrated circuit illustrating devices formed in a peripheral circuit area and a cell area according to another embodiment of the present invention.

FIG. 16 is a cross-sectional view illustrating a peripheral circuit area and a cell area according to an embodiment.

A MOS capacitor 35 of a peripheral circuit area Peri and a MOS transistor TR of a cell area are simultaneously formed and arranged on the same plane. A bit line BL is formed on the peripheral circuit area Peri and the cell area cell. In some cases, the bit line BL in the peripheral circuit area may be omitted.

First and second dummy storage node contact units SNC1 and SNC2 and a storage node contact unit SNC' are formed simultaneously on the peripheral circuit area Peri and the cell area, respectively. Dielectric layers 358 and 358' are formed on a semiconductor substrate 351 in which the dummy storage node contact units SNC1 and SNC2 and the storage node contact unit SNC' are formed and plate electrodes P and P' are formed on the dielectric layers 358 and 358'.

The reservoir capacitor having a capacity approximately similar to that of the cell area can be fabricated in the peripheral circuit area using a general fabrication process of a memory device.

In the above-described embodiments, cells capacitors having a capacity approximately similar to those of the cell area can be fabricated in the peripheral circuit area, and all the cell capacitors can be used as the reservoir capacitors. Thus, a capacitance of about μm corresponding to a cell array capacitance can be ensured so that noise and mesh characteristics may be improved when providing power.

In the embodiment, large capacity capacitors having a capacity approximately similar to those of the cell capacitor and the MOS capacitor can be formed without additional processes and thus various capacitances can be ensured.

The dummy capacitor and the MOS capacitor have different capacitances since different sources power each other.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A semiconductor integrated circuit, comprising:
a semiconductor substrate in which a cell area and a peripheral circuit area are defined;
a metal oxide semiconductor (MOS) capacitor formed on the semiconductor substrate corresponding to the peripheral circuit area; and
a dummy capacitor group formed on the peripheral circuit area to overlap the MOS capacitor,
wherein one electrode of the MOS capacitor and one electrode of the dummy capacitor group are connected to each other,
the other electrode of the MOS capacitor and the other electrode of the dummy capacitor group are connected to different voltage sources, and
the MOS capacitor includes an active region and a gate electrode formed on the active region on the semiconductor substrate of the peripheral circuit area and a bottom of the gate electrode has a bending surface.

2. The semiconductor integrated circuit of claim 1, wherein the dummy capacitor group includes:
a plurality of dummy capacitors, which are connected between the dummy storage node contact unit and the dummy plate electrode in parallel; and
a dummy storage node contact unit including a dummy storage node electrode formed on the peripheral circuit area, a dielectric layer covering the surfaces of the dummy storage node electrode and the plurality of dummy capacitors, and a dummy plate electrode formed on the dielectric layer.

3. The semiconductor integrated circuit of claim 2, wherein the one electrode of the dummy capacitor group is the dummy storage node contact unit and the other electrode of the dummy capacitor group is the dummy plate electrode.

4. The semiconductor integrated circuit of claim 2, wherein the dummy storage node contact unit of the dummy capacitor group includes:
a first dummy storage node contact unit formed on the peripheral circuit area; and
a second dummy storage node contact unit arranged adjacent to the first dummy storage node contact unit that receives a voltage different from a voltage applied to the first dummy storage node contact unit.

5. The semiconductor integrated circuit of claim 4, wherein the dummy capacitor group includes:
a first dummy capacitor group including the first dummy storage node contact unit, a dielectric layer formed on the first dummy storage node contact unit, and the dummy plate electrode formed on the dielectric layer; and a second dummy capacitor group including the second dummy storage node contact unit, a dielectric layer formed on the second dummy storage node contact unit, and the dummy plate electrode formed on the dielectric layer, wherein the first and second dummy capacitor groups are commonly connected to the dummy plate electrode.

6. The semiconductor integrated circuit of claim 5, wherein the one electrode of the dummy capacitor group is the first dummy storage node contact unit and the other electrode of the dummy capacitor group is the second dummy storage node contact unit.

7. The semiconductor integrated circuit of claim 2, wherein the dummy plate electrode of the dummy capacitor group includes:

a first dummy plate electrode formed on the peripheral circuit diagram; and a second dummy plate electrode arranged adjacent to the first dummy plate electrode and receives a voltage different from a voltage applied to the first dummy plate electrode.

8. The semiconductor integrated circuit of claim 7, wherein the dummy capacitor group includes:

a first dummy capacitor group including the dummy storage node contact unit, a dielectric layer formed on the dummy storage node contact unit, and a first dummy plate electrode formed on the dielectric layer; and a second dummy capacitor group including the dummy storage node contact unit, a dielectric layer formed on the dummy storage node contact unit, and a second dummy plate electrode formed on the dielectric layer, wherein the first and second dummy capacitor groups are commonly connected to the dummy storage node contact unit.

9. The semiconductor integrated circuit of claim 8, wherein the one electrode of the dummy capacitor group is the first dummy plate electrode and the other electrode of the dummy capacitor group is the second dummy plate electrode.

10. The semiconductor integrated circuit of claim 1, wherein the dummy capacitor group includes a bit line formed on the peripheral circuit area, an insulating layer formed on the bit line, and a dummy plate electrode formed on the insulating layer.

11. The semiconductor integrated circuit of claim 10, wherein the bit line includes:

a first bit line formed on the peripheral circuit area; and a second bit line arranged adjacent to the first bit line that receives a voltage different from a voltage applied to the first bit line.

12. The semiconductor integrated circuit of claim 11, wherein the dummy capacitor group includes:

a first dummy capacitor group including a first bit line, the insulating layer, and the dummy plate electrode; and a second dummy capacitor group including a second bit line, the insulating layer, and the dummy plate electrode.

13. The semiconductor integrated circuit of claim 12, wherein the one electrode of the dummy capacitor group is the first bit line; and the other electrode of the dummy capacitor group is the second bit line.

14. The semiconductor integrated circuit of claim 10, wherein the dummy plate electrode includes:

a first dummy plate electrode formed on the peripheral circuit area; and a second dummy plate electrode arranged adjacent to the first dummy plate electrode that receives a voltage different from a voltage applied to the first dummy plate electrode.

15. The semiconductor integrated circuit of claim 9, wherein the dummy capacitor group includes:

a first dummy capacitor group including the bit line, the insulating layer, and a first dummy plate electrode; and a second dummy capacitor group including the bit line, the insulating layer, and a second dummy plate electrode.

16. The semiconductor integrated circuit of claim 15, wherein the one electrode of the dummy capacitor group is the first dummy plate electrode and the other electrode of the dummy capacitor group is the second dummy plate electrode.

17. The semiconductor integrated circuit of claim 15, wherein the cell area includes a plurality of cell array areas in which a plurality of cell capacitors is formed.

18. The semiconductor integrated circuit of claim 17, wherein the dummy capacitor group includes a plurality of dummy capacitor groups, wherein a capacitance of each of the plurality of dummy capacitor groups corresponds to a total capacitance of cell capacitors formed in one of the plurality of cell array areas formed in the cell area.

19. A semiconductor integrated circuit, comprising:

a semiconductor substrate including a cell area and a peripheral circuit area;

a plurality of cell array areas formed on the cell area and including a plurality of cell capacitors;

a plurality of dummy capacitor groups formed on the peripheral circuit area and connected to each other; and a metal oxide semiconductor (MOS) capacitor arranged between the semiconductor substrate and the plurality of dummy capacitor groups and electrically connected to one of the plurality of dummy capacitor groups, wherein the MOS capacitor includes an active region and a gate electrode formed on the active region on the semiconductor substrate of the peripheral circuit area and a bottom of the gate electrode has a bending surface.

* * * * *